(12) United States Patent
Chung et al.

(10) Patent No.: US 7,034,350 B2
(45) Date of Patent: Apr. 25, 2006

(54) CAPACITORS INCLUDING A CAVITY CONTAINING A BURIED LAYER

(75) Inventors: Suk-jin Chung, Kyungki-do (KR); Wan-don Kim, Kyungki-do (KR); Cha-young Yoo, Kyungki-do (KR); Kwang-hee Lee, Seoul (KR); Han-jin Lim, Seoul (KR); Jin-il Lee, Kyungki-do (KR)

(73) Assignee: Samsung Electronics Co., Ltd., (KR)

( * ) Notice: Subject to any disclaimer, the term of this patent is extended or adjusted under 35 U.S.C. 154(b) by 34 days.

(21) Appl. No.: 10/795,020

(22) Filed: Mar. 5, 2004

(65) Prior Publication Data

US 2004/0232463 A1 Nov. 25, 2004

(30) Foreign Application Priority Data

May 23, 2003 (KR) ..................... 10-2003-0032885

(51) Int. Cl.
*H01L 27/108* (2006.01)

(52) U.S. Cl. .................... 257/296; 438/239; 438/240; 438/241; 438/250; 438/253; 438/396

(58) Field of Classification Search ................ 438/239, 438/240, 241, 250, 253, 396
See application file for complete search history.

(56) References Cited

U.S. PATENT DOCUMENTS 6,559,025 B1 * 5/2003 Kim .......................... 438/396
2001/0044179 A1 11/2001 Kim

* cited by examiner

*Primary Examiner*—Mai-Huong Tran
(74) *Attorney, Agent, or Firm*—Myers Bigel Sibley & Sajovec

(57) ABSTRACT

Capacitors include an integrated circuit (semiconductor) substrate and an interlayer dielectric disposed on the integrated circuit substrate and including a metal plug therein. A lower electrode is disposed on the interlayer dielectric and contacting the metal plug. The lower electrode includes a cavity therein and a buried layer in the cavity. The buried layer is an oxygen absorbing material. A dielectric layer disposed on the lower electrode and an upper electrode is disposed on the dielectric layer. The lower electrode may be a noble metal layer. The buried layer may fill in the cavity and may not contain oxygen ($O_2$) when initially formed.

10 Claims, 7 Drawing Sheets

CAPACITORS INCLUDING A CAVITY CONTAINING A BURIED LAYER

CLAIM OF PRIORITY

This application claims priority from Korean Patent Application No. 2003-32885, filed on May 23, 2003, in the Korean Intellectual Property Office, the disclosure of which is hereby incorporated herein by reference.

BACKGROUND OF THE INVENTION

The present invention relates to capacitors and methods of manufacturing the same. More particularly, the present invention relates to integrated circuit (semiconductor) device capacitors contacting an underlying metal plug and methods of manufacturing the same.

As the integration density of integrated circuit (semiconductor) devices has increased, the area occupied by a semiconductor device within a chip has generally decreased. Capacitors for storing information in dynamic random access memory (DRAM) devices are typically required to occupy smaller areas while maintaining the same or larger capacitance as conventional capacitors. Conventionally, to increase the capacitance of such a capacitor, a concave or cylindrical lower electrode may be manufactured and a high-k dielectric layer, such as a TaO layer, may be used. When a high-k dielectric layer is used, a lower electrode may be formed of a material having a high work function, such as ruthenium (Ru) and/or platinum (Pt) to reduce leakage current between the lower electrode and the dielectric layer.

For a concave lower electrode, only the inward walls of a concave are generally used to provide capacitance. As a result, when a distance between the inward walls of the concave becomes narrower with a reduction in a device design rule, depositing a dielectric layer typically becomes more difficult. As a result, the concave lower electrode may be inadequate for highly integrated memory devices.

Although a cylindrical lower electrode may advantageously provide capacitance not only with the inward walls but also with the outward walls thereof, depositing a dielectric layer in such a structure may still be difficult with a reduction in an associated design rule. The cylindrical structure may also be unstable.

As a result of these limitations, a stack-type lower electrode may be used as will be described with reference to FIG. 1. As shown in FIG. 1, an interlayer dielectric (ILD) 15 is formed on an integrated circuit (semiconductor) substrate 10 where, for example, a metal oxide semiconductor (MOS) transistor is formed. A plug 20 is formed in the ILD 15 so as to electrically contact one of the junctions of the MOS transistor, for example, a source region of the transistor. The plug may be formed of TiN, which will generally not react with a subsequently formed noble metal lower electrode.

A stack-type lower electrode 25 is formed contacting the TiN plug 20. The lower electrode 25 may be formed of a noble metal such as Ruthenium (Ru). The lower electrode 25 may be formed using chemical vapor deposition (CVD) by supplying a Ru source and an $O_2$ reactant gas. Subsequently, an electrode thermal treatment (or a preprocessing) may be carried out, for example, at a temperature of about 600° to limit or prevent transformation of the lower electrode 25.

As shown in FIG. 1, a dielectric layer, for example, a TaO layer 30, is deposited on the surface of the lower electrode 25 over the ILD 15. The TaO layer 30 can be deposited using CVD by supplying a Ta source and an $O_2$ reactant source. The TaO layer 30 may be deposited in an $O_2$ atmosphere, which may improve dielectric characteristics thereof. The TaO layer may be thermally treated to improve its dielectric constant. An upper electrode 35 is formed on the TaO layer to complete a capacitor 40.

A conventional capacitor, such as illustrated in FIG. 1, generally has various limitations. The formation of the Ru lower electrode using CVD generally needs $O_2$ and the deposition of the TaO layer 30 also generally requires a large amount of $O_2$. Although it is possible to manufacture a lower electrode using physical vapor deposition (PVD), which generally does not require $O_2$, highly integrated memory devices are generally formed using CVD because the PVD process may degrade step coverage characteristics. Where the lower electrode 25 is formed using CVD, a large amount of $O_2$ is typically solid-dissolved in the lower electrode 25 and the TaO layer 30 and then diffuses to the outside, especially, toward the TiN plug 20. As a result, the surface of the TiN plug 20 may be oxidized and a $TiO_2$ layer 50 may be formed at an interface between the Ru lower electrode 25 and the TiN plug 20. Due to the unwanted $TiO_2$ layer, lifting may occur between the lower electrode 25 and the TiN plug 20 and contact resistance may increase, which may result in failures.

FIG. 2 is a graph of measurement results showing contact resistance of the TiN plug 20 before and after the TaO layer is thermally treated. As shown in FIG. 2, before the thermal treatment, contact resistance between the lower electrode 25 and the TiN plug 20 is about $10^2$ to $10^4$ ohms/number of contacts ($\Omega$/cnt, where cnt is contact area)(which typically depends on the diameter of the contact), which is relatively low. However, as the thermal treatment was provided, the contact resistance is significantly increased to be about $10^9$ $\Omega$/cnt. The thermal treatment may be, for example, a preprocessing of the lower electrode performed before deposition of a dielectric layer.

Furthermore, when a stack-type lower electrode is formed of Ru, $O_2$ contained in the Ru layer generally diffuses into the surface of the electrode as well as the TiN plug 20 while the TaO layer 30 is thermally treated and during other subsequent thermal treatments. As a result, the surface of the lower electrode may suffer agglomeration, which may adversely transform the lower electrode.

SUMMARY OF THE INVENTION

Embodiments of the present invention provide capacitors including an integrated circuit substrate and an interlayer dielectric disposed on the integrated circuit substrate and including a metal plug therein. A lower electrode is disposed on the interlayer dielectric and contacting the metal plug. The lower electrode includes a cavity therein and a buried layer in the cavity. The buried layer is an oxygen absorbing material. A dielectric layer is disposed on the lower electrode and an upper electrode is disposed on the dielectric layer. The lower electrode may be a layer of a noble metal. The buried layer may fill in the cavity and may not contain oxygen ($O_2$) when initially formed.

In other embodiments of the present invention, the metal plug is titanium nitride (TiN). The noble metal layer may be ruthenium (Ru), platinum (Pt), iridium (Ir), osmium (Os), palladium (Pd), tungsten (W) and/or cobalt (Co). The buried layer may be a material that is etch resistant to etch chemicals used to etch silicon oxide. The buried layer may be tantalum oxide (TaO), titanium dioxide ($TiO_2$), silicon nitride (SiN) and/or silicon (Si).

In further embodiments of the present invention, an oxygen barrier layer is interposed between the noble metal layer and the buried layer. The oxygen barrier layer may be a material having an oxidative characteristic greater than the oxidative characteristic of the metal plug. The oxygen barrier layer may be titanium (Ti), titanium rich titanium nitride (Ti-rich TiN), aluminum (Al), tungsten (W) and/or tantalum nitride (TaN).

In other embodiments of the present invention, the upper electrode extends along the interlayer dielectric beyond a region including the lower electrode. An etch stopper is interposed between the upper electrode and the interlayer dielectric.

In further embodiments of the present invention, capacitors are provided including an integrated circuit substrate and an interlayer dielectric disposed on the integrated circuit substrate and including a metal plug therein. A lower electrode is disposed on the interlayer dielectric and contacting the metal plug. The lower electrode includes a noble metal layer having a cavity therein, a buried layer filled in the cavity and an oxygen barrier layer interposed between the noble metal layer and the buried layer. A dielectric layer is disposed on the lower electrode and an upper electrode disposed on the dielectric layer. The buried layer is a material layer which does not contain oxygen ($O_2$) and which is capable of absorbing additional $O_2$ and the oxygen barrier layer is a material layer having a better oxidative characteristic than the oxidative characteristic of the metal plug.

In other embodiments of the present invention, methods are provided of manufacturing a capacitor. An interlayer dielectric is formed on an integrated circuit substrate and a metal plug is formed in the interlayer dielectric. A lower electrode is formed electrically contacting the metal plug, including forming a conductive layer including a cavity and electrically contacting the metal plug and forming a buried layer in the cavity. A dielectric layer is formed on the lower electrode and an upper electrode is formed on the dielectric layer. The buried layer may be formed of a material that is etch resistant to etch chemicals used to etch silicon oxide and the conductive layer may be a noble metal layer. The buried layer may be an oxygen absorbing material.

In further embodiments of the present invention, forming the lower electrode includes sequentially stacking an etch stopper and a mold oxide layer on the interlayer dielectric in a region where the metal plug is formed. Portions of the mold oxide layer and the etch stopper are etched until the metal plug and a region adjacent to the metal plug are exposed to define a lower electrode region. A noble metal layer is deposited on the mold oxide layer, including defining a cavity region in the lower electrode region. A buried layer is deposited on the noble metal layer in the cavity region in the lower electrode region. The buried layer has a different etch rate than that of the mold oxide layer. The buried layer and the noble metal layer are planarized until the mold oxide layer is exposed and the mold oxide layer is removed.

The noble metal layer may be ruthenium (Ru), platinum (Pt), iridium (Ir), osmium (Os), palladium (Pd), tungsten (W) and/or cobalt (Co). The buried layer may be tantalum oxide (TaO), titanium dioxide ($TiO_2$), silicon nitride (SiN) and/or silicon (Si), wherein the SiN and Si are free of oxygen ($O_2$) when formed. The buried layer may be formed by depositing a titanium oxide (TaO) layer in a nitrogen ($N_2$) atmosphere.

In other embodiments of the present invention, an oxygen barrier layer is formed on the noble metal layer before forming the buried layer. Forming the oxygen barrier layer may include forming the oxygen barrier layer of a material having an oxidative characteristic greater than the oxidative characteristic of the metal plug. The oxygen barrier layer may be formed layer from titanium (Ti), titanium rich titanium nitride (Ti-rich TiN), aluminum (Al), tungsten (W) and/or tantalum nitride (TaN).

In further embodiments of the present invention, removing the mold oxide layer includes removing the mold oxide layer using etch chemicals used to etch silicon oxide. The method may further include thermally treating the lower electrode before forming the dielectric layer. Thermally treating the lower electrode may include thermally treating the lower electrode in an inert gas atmosphere at a temperature of from about 400° to about 750°.

In other embodiments of the present invention, forming the dielectric layer includes depositing a tantalum oxide (TaO) layer on the lower electrode in an oxygen ($O_2$) atmosphere and thermally treating the TaO layer to crystallize a portion of the TaO layer. Thermally treating the TaO layer may include thermally treating the TaO layer in a nitrogen ($N_2$) atmosphere at a temperature of from about 600° to about 700°.

In further embodiments of the present invention, manufacturing a capacitor includes forming an interlayer dielectric on a semiconductor substrate and forming a metal plug in a predetermined portion of the interlayer dielectric. An etch stopper and a mold oxide layer are formed on the interlayer dielectric. A lower electrode region is formed including etching the mold oxide layer and the etch stopper until the metal plug and a region adjacent to the metal plug are exposed. A noble metal layer, an oxygen barrier layer and a buried layer are sequentially stacked on the mold oxide layer in the lower electrode region. The lower electrode region is filled by planarizing the buried layer, the oxygen barrier layer and the noble metal layer. The mold oxide layer is removed to define a lower electrode. A dielectric layer is formed on the lower electrode and an upper electrode is formed on the dielectric layer.

In other embodiments of the present invention, manufacturing a capacitor includes forming an interlayer dielectric on a semiconductor substrate and forming a metal plug in a predetermined portion of the interlayer dielectric. An etch stopper and a mold oxide layer are formed on the interlayer dielectric. A lower electrode region is formed by etching the mold oxide layer and the etch stopper until the metal plug and a region adjacent to the metal plug are exposed. A noble metal layer, an oxygen barrier layer and a buried layer are sequentially stacked on the mold oxide layer. The lower electrode region is filled by planarizing the buried layer, the oxygen barrier layer and the noble metal layer to define a resultant structure. The resultant structure is thermally treated and then the mold oxide layer and the buried layer are removed. The oxygen barrier layer is removed to define a lower electrode. A dielectric layer is formed on the lower electrode and an upper electrode is formed on the dielectric layer.

BRIEF DESCRIPTION OF THE DRAWINGS

The above and other features and advantages of the present invention will become more apparent by describing embodiments thereof with reference to the attached drawings in which.

DETAILED DESCRIPTION OF THE INVENTION

Figure 1:
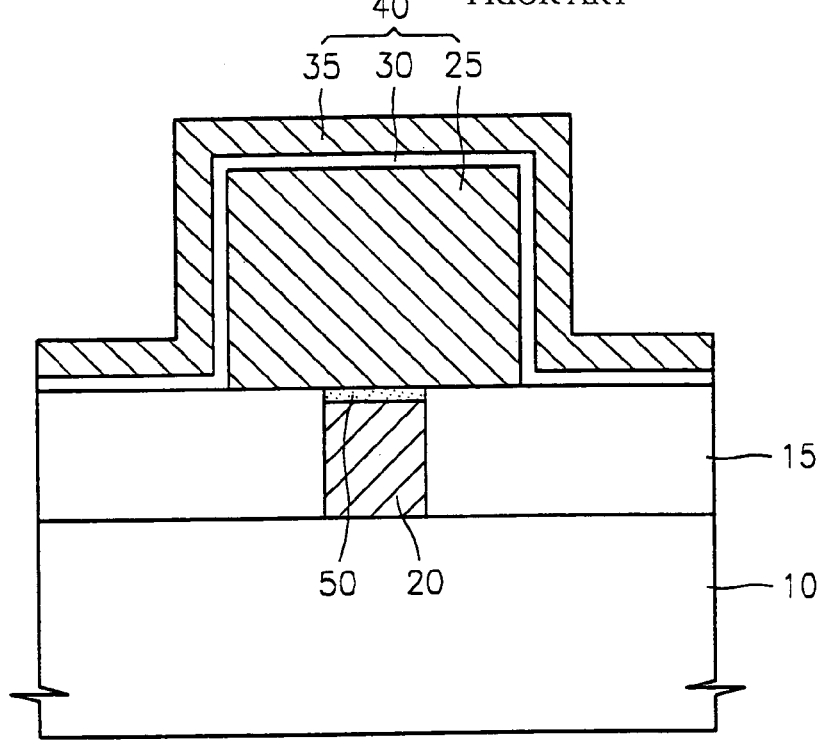
FIG. 1 is a cross-sectional illustration of a capacitor including a conventional stack-type lower electrode.
Figure 2:
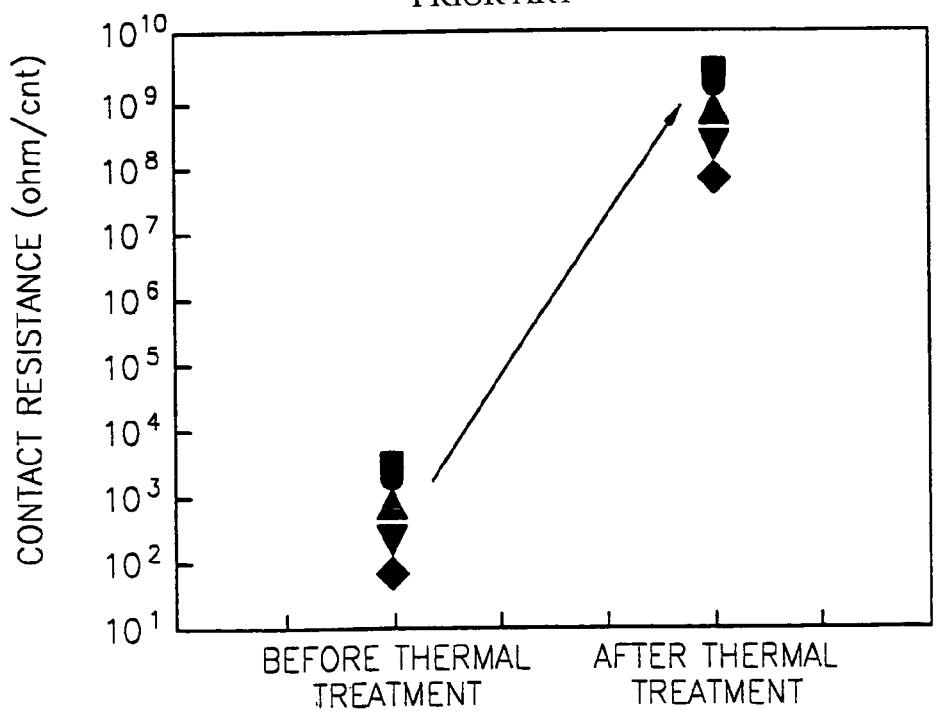
FIG. 2 is a graph illustrating contact resistance of a TiN plug before and after thermal treatment.

The present invention now will be described more fully hereinafter with reference to the accompanying drawings, in which embodiments of the invention are shown; This invention may, however, be embodied in many different forms and should not be construed as limited to the embodiments set forth herein. Rather, these embodiments-are provided so that this disclosure will be thorough and complete, and will fully convey the scope of the invention to those skilled in the art. In the drawings, the relative sizes of regions may be exaggerated for clarity. It will be understood that when an element is referred to as being "attached", "connected" or "coupled" to another element, it can be directly connected or coupled to the other element or intervening elements may be present. In contrast, when an element is referred to as being "directly attached," "directly connected" or "directly coupled" to another element, there are no intervening elements present. Like numbers refer to like elements throughout the specification. As used herein the term "and/or" includes any and all combinations of one or more of the associated listed items.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure.

Figure 3:
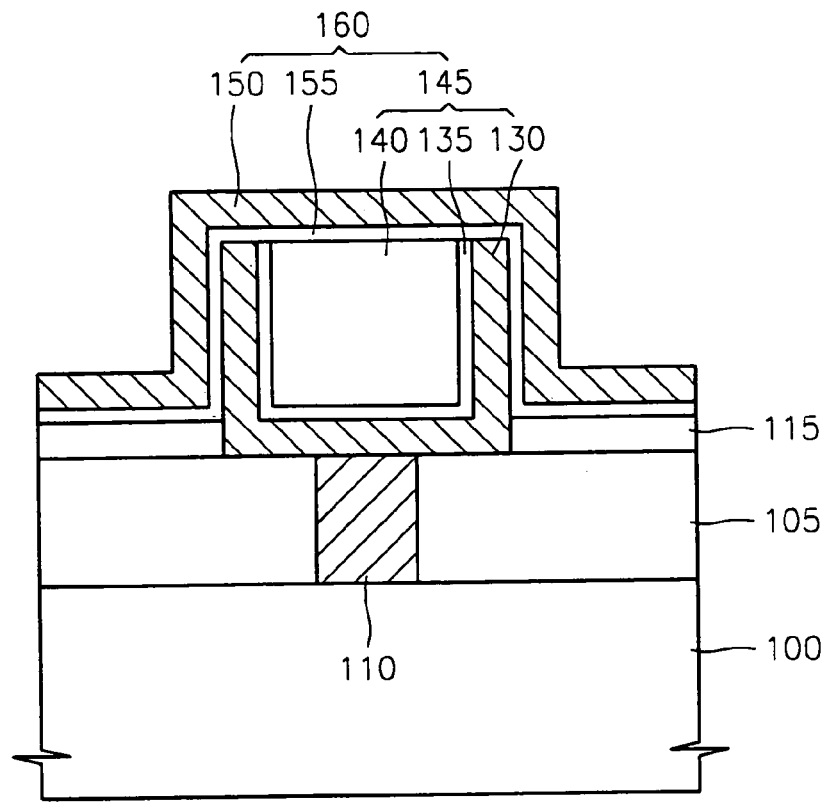
FIG. 3 is a cross-sectional view illustrating a capacitor according to some embodiments of the present invention.
Figure 4A:
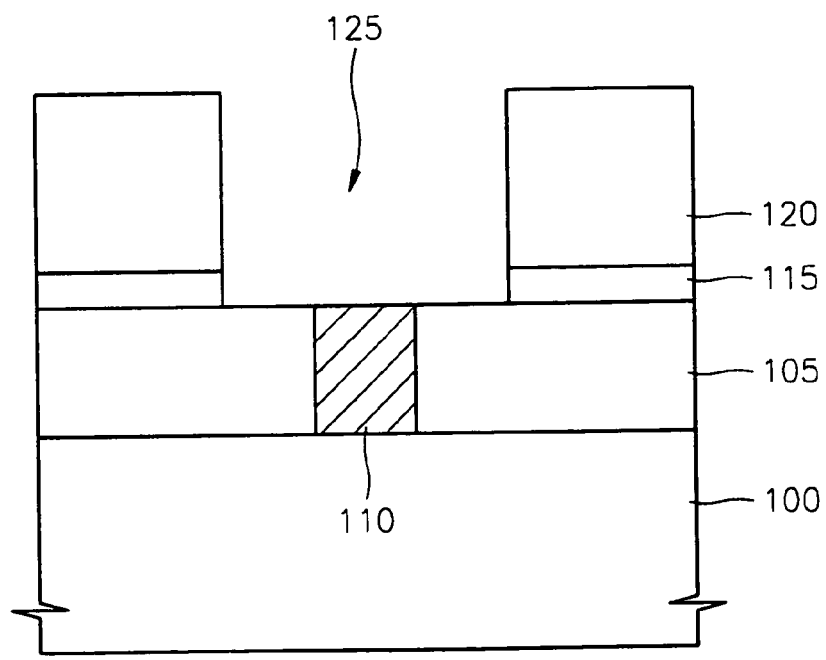
FIGS. 4A through 4C are cross-sectional views illustrating methods of manufacturing the capacitor of FIG. 3 according to some embodiments of the present invention.
Figure 4B:
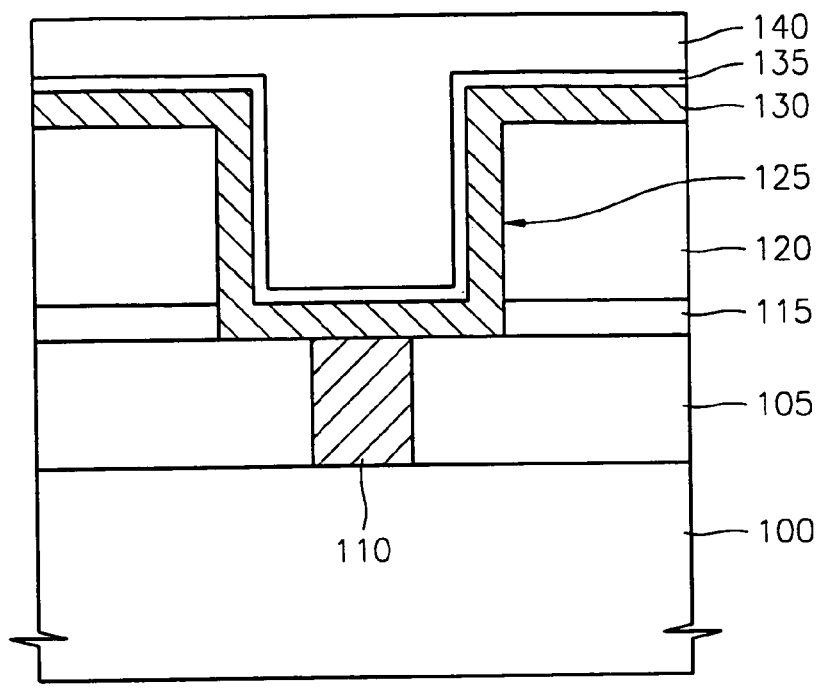
Figure 4C:
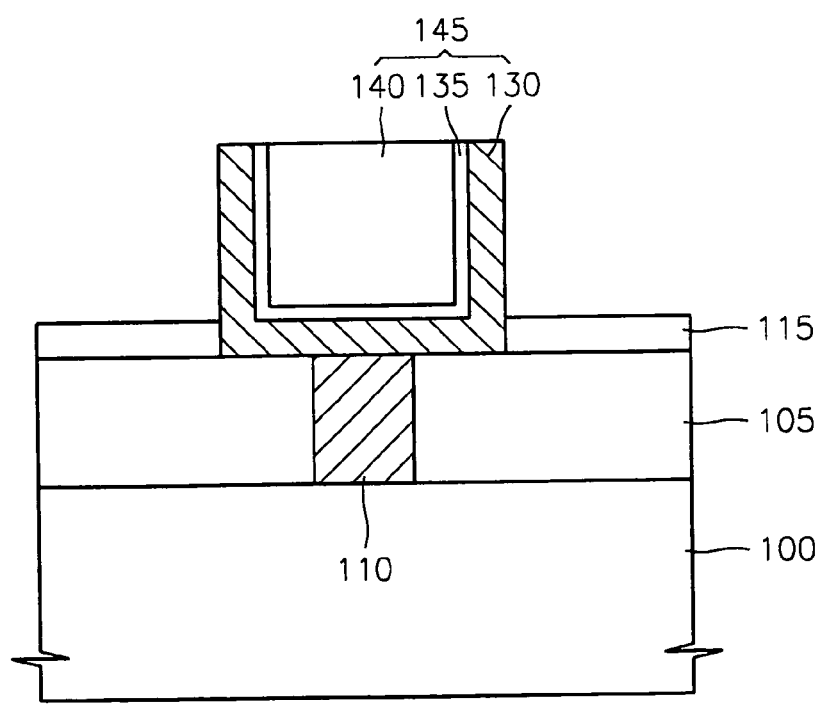

FIG. 3 is a cross-sectional illustration of a capacitor according to some embodiments of the present invention. FIGS. 4A through 4C are cross-sectional views illustrating methods of manufacturing the capacitor of FIG. 3 according to some embodiments of the present invention.

As shown in the embodiments of FIG. 3, an ILD 105 is disposed on an integrated circuit (semiconductor) substrate 100. The semiconductor substrate 100 may include, for example, a MOS transistor (including a gate, a source, and a drain), a bit line, and connection pads disposed in an upper portion of the semiconductor substrate 100.

A plug 110 is positioned in the ILD 105, for example, to provide an electrical connection to the source. The plug 110 may be formed of a metal material, which is highly conductive and may improve contact characteristics between the plug 110 and a noble metal lower electrode to be formed on the plug 110 as will be described later herein. A conventional plug is typically formed of doped polysilicon, which may have a high resistance and may cause a silicidation with a noble metal of the lower electrode, which in turn may lead to volume expansion. As a result, lifting may occur at the contact between the plug 110 and the lower electrode. In some embodiments of the present invention, the plug 110 for connecting the lower electrode and the source (or a connection pad connected to the source) is formed of TiN, which is highly conductive and generally has a minimal reaction with the lower electrode material.

As shown in the embodiments of FIG. 3, a lower electrode 145 is disposed on the ILD 105 contacting the plug 110. The lower electrode 145 shown in FIG. 3 includes a Ru layer 130 that includes a cavity, a buried layer 140 filled in the cavity, and an oxygen barrier layer 135 interposed between the Ru layer 130 and the buried layer 140.

The Ru layer 130 functions as an electrode in the structure of the lower electrode 145. In other embodiments of the present invention, instead of the Ru layer 130, a layer formed of one or more of the other noble metals, such as Pt, Ir, Os, Pd, W, and/or Co, may be used.

The buried layer 140 is filled in the cavity included in the Ru layer 130. In some embodiments of the present invention, the buried layer 140 is formed of a material that is not removed by etch chemicals used for removing silicon oxide but which can be oxidized. In particular, the buried layer 140 may be formed of a material that can absorb additional oxygen. The buried layer 140 can be formed, for example, of one or more material such as, for example, TaO, $TiO_2$, SiN, and/or Si. In particular embodiments as illustrated in FIG. 3, a TaO layer, which lacks $O_2$, may be used.

The oxygen barrier layer 135 may be formed of a material having a better oxidative characteristic than the TiN plug 110. For example, the oxygen barrier layer 135 may be formed of one or more of Ti, Ti-rich TiN, Al, W, and/or TaN.

An etch stopper 115 may be provided that covers the ILD 105 on both sides of the lower electrode 145 and protects the ILD 105. As shown in the embodiments of FIG. 3, a TaO layer 155 is coated as a dielectric layer on the lower electrode. The TaO layer 155 may be partially or wholly crystallized to provide a high dielectric constant. An upper electrode 150 is disposed on the TaO layer 155 to complete a capacitor 165 in the embodiments of FIG. 3. The upper electrode 150 may be formed, for example, of a noble metal layer.

Methods of manufacturing the capacitor of FIG. 3 will now be described with reference to FIGS. 4A through 4C. As shown in FIG. 4A, an ILD 105 is deposited on an integrated circuit (semiconductor) substrate 100 including a MOS transistor, a bit line and connection pads formed thereon. The ILD 105 can be formed of a silicon oxide layer. The formed ILD 105 may be etched until a source of the MOS transistor or a connection pad connected to the source is exposed, thereby forming a contact hole. A TiN layer may then be deposited on the ILD 105 to fill the contact hole and planarized, for example, by chemical mechanical polishing (CMP) or an etchback process, to form a TiN plug 110 in the ILD 105.

For the embodiments shown in FIG. 4A-4C, an etch stopper 115 and a mold oxide layer 120 are sequentially stacked on the ILD 105 in the region where the TiN plug 110 is formed. The etch stopper 115, which may be used to protect the ILD 105, may be formed of a material having a different etch rate (with respect to a particular reference etch chemistry) than that of the ILD 105, for example, silicon nitride (SiN). The mold oxide layer 120 may be, for example, a tetraethoxysilane (TEOS) layer or a spin on glass (SOG) layer, which can typically be easily removed later. The mold oxide layer 120 and the etch stopper 115 may then be selectively etched until the region where the plug 110 is formed is exposed to define a lower electrode region 125.

Referring now to the embodiments illustrated in FIG. 4B, a noble metal layer, such as a Ru layer 130, is deposited contacting the exposed plug 110. The Ru layer 130 may be formed using CVD by supplying a Ru source and an $O_2$ source, which may provide an improved step coverage. The Ru layer 130 may be formed to a thickness of, for example, about 200 Å to 500 Å.

For the illustrated embodiments, an oxygen barrier layer 135 is deposited on the Ru layer 130. The oxygen barrier layer 135 may be formed of a material having a better oxidative characteristic than the plug 110, for example, one or more of Ti, Ti-rich TiN, Al, W, and/or TaN, as described above. The oxygen barrier layer 135 may be formed, for example, to a thickness of about 50 Å to 200 Å using CVD.

A buried layer 140 is formed on the oxygen barrier layer 135 so as to fill the lower electrode region 125. The buried layer 140 in some embodiments of the present invention is formed of a material that is resistant to being removed by etch chemicals used for removing silicon oxide, in other words, a material having a different etch rate (with respect to a particular reference etch chemistry) than that of the mold oxide layer 120, which is also capable of absorbing additional oxygen. For example, the buried layer can be formed of one or more of TaO, $TiO_2$, SiN, and/or Si. In the illustrated embodiments of FIGS. 4A–4C, a TaO layer, which lacks $O_2$, is deposited in a $N_2$ atmosphere.

Referring now to the embodiments of FIG. 4C, the buried layer 140, the oxygen barrier layer 135 and the Ru layer 130 are planarized using, for example, CMP or an etchback process, until the surface of the mold oxide layer 120 is exposed to form a stack type lower electrode filled in the lower electrode region 125 (shown in FIG. 4A). The mold oxide layer 120 is removed, for example, using etch chemicals used for removing silicon oxide, such as a HF-containing solution. The buried layer 140, which is disposed within the lower electrode region 125, is not significantly removed by the etch chemicals used for removing silicon oxide. Thus, the stack-type lower electrode 145 and the etch stopper 115, disposed on both sides of the lower electrode 145, remain on the ILD 105. The ILD 105, which may be formed of a $SiO_2$-related compound, is protected by the etch stopper 115 from the etch chemicals used for removing silicon oxide.

Referring again to FIG. 3 and FIG. 4B, before a dielectric layer is formed, the resultant lower electrode structure may be pre-processed in an inert gas atmosphere, for example, a $N_2$ atmosphere, at a temperature of about 400° to 750°, which may reduce or prevent transformation of the lower electrode 145. This preprocessing typically causes grains to grow in the Ru layer 130 constituting the lower electrode 145 to make the Ru layer 130 dense. As a result, penetration of oxygen may be reduced or prevented during the subsequent deposition of the dielectric layer.

After such a preprocessing, a TaO layer 155 may be deposited as a dielectric layer on the surface of the lower electrode 145. The TaO layer 155 may be deposited in an $O_2$ atmosphere, which may improve its dielectric characteristics. After the TaO layer 155 is deposited, it may be thermally treated at a temperature of about 600° to 700°, which may further improve its dielectric characteristics. Immediately after the deposition, the TaO layer 155 is typically in an amorphous state and has a low dielectric constant. Once a thermal treatment is carried out at a temperature of about 600° to 700°, the TaO layer 155 may be partially or wholly crystallized and have an improved dielectric constant. The thermal treatment may be carried out in a $N_2$ atmosphere, which may reduce or prevent additional penetration of oxygen.

A noble metal layer may be deposited on the dielectric TaO layer 155 and then patterned to a predetermined portion, to form an upper electrode 150. Thus, a capacitor 160 may be formed. The capacitor 160 of some embodiments of the present invention includes an oxygen barrier layer 135, which is oxidized faster than the TiN plug 110 included in the lower electrode 145. The oxygen barrier layer 135 may reduce or prevent diffusion of oxygen contained in the Ru layer 130 and/or the TaO layer 155 toward the TiN plug 110 in a subsequent thermal treatment. In other words as the oxygen barrier layer 135 generally has a better oxidative characteristic than the TiN plug 110, it absorbs oxygen diffused toward the TiN plug 110 during the thermal treatment.

The buried layer 140, which is capable of oxidation as described above, may also absorb oxygen contained in the Ru layer 130 and the TaO layer 155. Thus, as most of oxygen contained in the Ru layer 130 and the TaO layer 155 may be absorbed in the oxygen barrier layer 135 and the buried layer 140, diffusion of oxygen into the TiN plug 110 can be reduced or even prevented.

Figure 5:
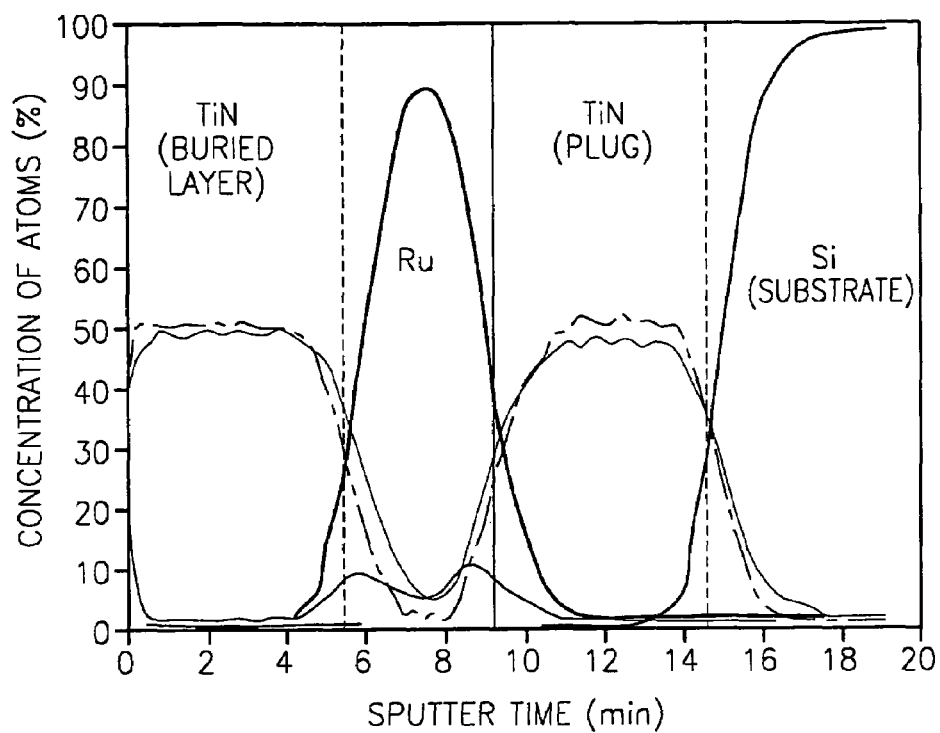
FIGS. 5 and 6 are graphs of Auger electron spectroscopy (AES) results illustrating oxygen distributions in a lower electrode and a TiN plug before and after thermal treatment.
Figure 6:
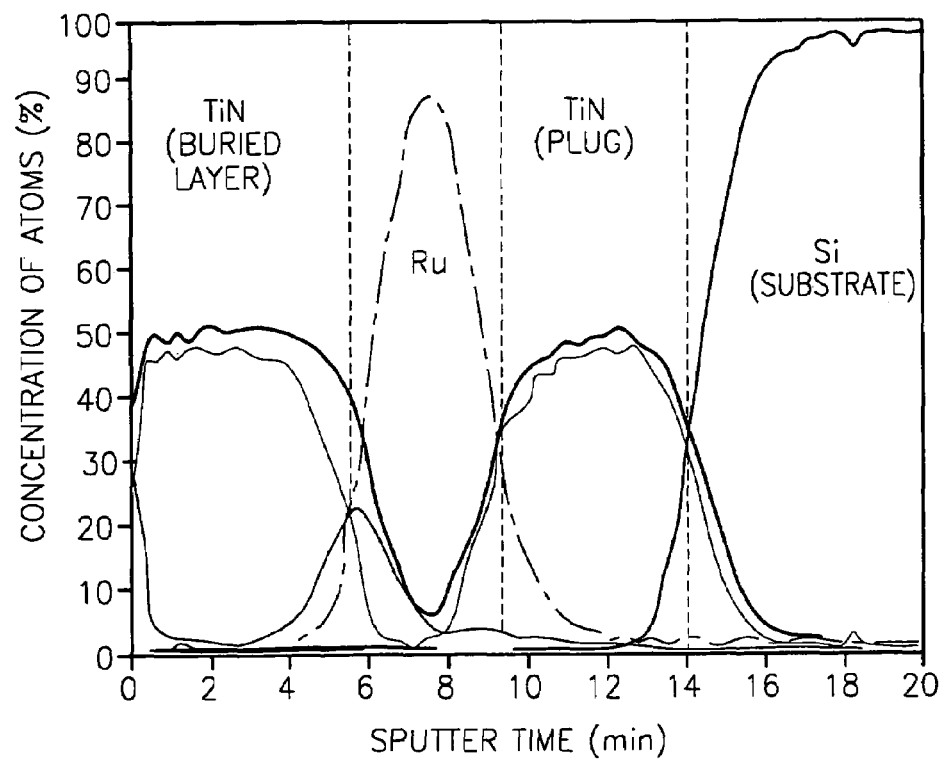

FIGS. 5 and 6 are graphs of Auger electron spectroscopy (AES) results showing oxygen distributions in a lower electrode and a TiN plug before and after thermal treatment. AES analysis is a method of sputtering a layer using predetermined atoms to analyze elements of the layer through the emitted elements.

FIG. 5 is a graph of results obtained when the AES analysis is performed without preprocessing after the lower electrode 145 is completed. Oxygen atoms are distributed at an interface between the TiN plug 110 and the Ru layer 130, in the Ru layer 130 and at an interface between the Ru layer 130 and the oxygen barrier layer 135.

Thereafter, the lower electrode is thermally treated at a temperature of about 650° to 750°. As a result, as shown in FIG. 6, while the oxygen atoms move into the oxygen barrier layer 135, which has a relatively good oxidative characteristic, they do not exist at the interface between the TiN plug 110 and the Ru layer 130. Consequently, it is observed that, after the thermal treatment, most of the oxygen atoms contained in the Ru layer 130 move into the oxygen barrier layer 135 and the surface of the TiN plug 110 is not significantly oxidized.

Figure 7:
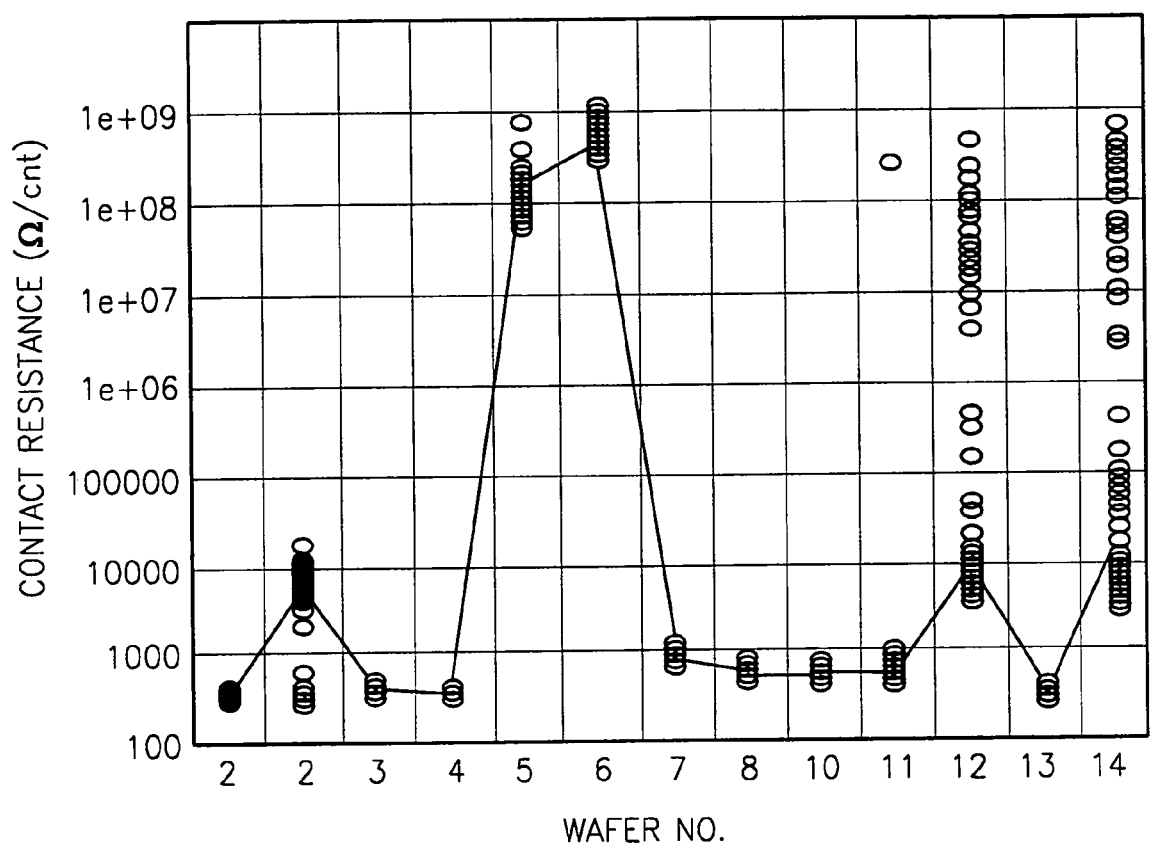
FIG. 7 is a graph illustrating contact resistance of a TiN plug of wafers where lower electrodes are formed under various conditions.

FIG. 7 is a graph showing contact resistances of TiN plugs of each wafer where lower electrodes are formed under various conditions. In FIG. 7, the x-axis represents reference wafer numbers (Nos.). In wafer No. 02, a Ru layer is deposited using physical vapor deposition (PVD) without supply of oxygen, and, in wafer No. 06, a Ru layer is deposited using CVD and a preprocessing is performed. In wafer No. 08, provided according to some embodiments of the present invention, a Ru layer is deposited using CVD, a Ti-rich TiN oxygen barrier layer is formed, a TaO buried layer is formed and a preprocessing is performed. In wafer No. 10, also provided according to some embodiments of the present invention, a Ru layer is deposited using CVD, a Ti-rich TiN oxygen barrier layer is formed and then a TaO buried layer is formed. Thereafter, a preprocessing is performed, a TaO dielectric layer is formed and the dielectric layer is thermally treated.

In the case of wafer No. 6, when the Ru layer is formed using CVD and then the preprocessing is performed, the surface of the TiN plug is oxidized such that resistance increases to be $10^8$ Ω/cnt or higher. However, when the oxygen barrier layer 135 is formed according to some embodiments of the present invention as shown in the cases of wafer Nos. 8 and 9, contact resistance is as low as 1000 Ω/cnt or lower, and this result is similar to when a Ru layer is formed using PVD.

Figure 8:
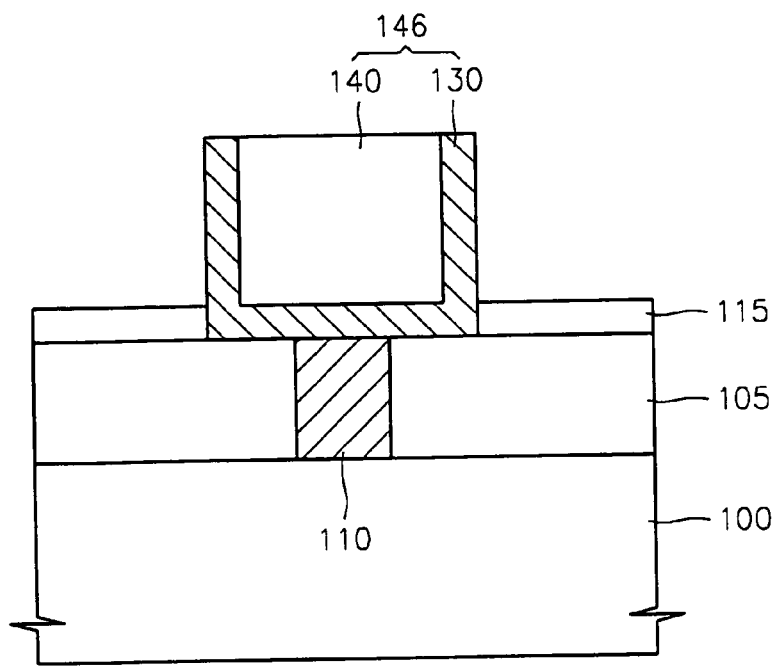
FIG. 8 is a cross-sectional view illustrating a capacitor according to some other embodiments of the present invention.

FIG. 8 is a cross-sectional view illustrating a capacitor according to further embodiments of the present invention. In the illustrated embodiments of FIG. 8, the same reference numerals as in the embodiments of FIG. 3 are used to denote the corresponding elements, and a description thereof will not be repeated here.

As shown in the embodiments of FIG. 8, a lower electrode 146 includes a Ru layer 130 including a cavity and a buried layer 140 that is filled in the Ru layer 130. As described with reference to the embodiments of FIG. 3, another noble metal layer can be used instead of the Ru layer 130. Also, the buried layer 140 may be formed of a material that is not significantly removed by etch chemicals used for removing silicon oxide, such as a material having a different etch rate than that of the mold oxide layer 120 and which is capable of absorbing additional oxygen. The buried layer 140 can be formed of, for example, one or more of TaO, TiO2, SiN, and/or Si. More particularly, the buried layer 140 may be of a TaO layer that may be deposited in a $N_2$ atmosphere in such embodiments. The dielectric layer and the upper electrode may be the same as in the embodiments of FIG. 3.

Methods of manufacturing the capacitor of FIG. 8 according some embodiments of the present invention will now be described. Initially, a Ru layer 130 and a buried layer 140 may be sequentially stacked on the resultant structure shown in FIG. 4A. The buried layer 140 and the Ru layer 130 may be planarized until the surface of the mold oxide layer 120 is exposed and then the mold oxide layer 120 may be removed using etch chemicals, thereby completing a lower electrode 146 (FIG. 8).

As described with reference to FIG. 3 and FIGS. 4A–4C, a preprocessing of the lower electrode 146, formation of a dielectric layer, a thermal treatment of the dielectric layer and formation of an upper electrode may be sequentially carried out. For the embodiments of FIG. 8, after the thermal treatment, oxygen atoms contained in the Ru layer 130 and the dielectric layer may be absorbed into the buried layer 140 and diffusion of oxygen into the plug 110 can be reduced or prevented.

Figure 9A:
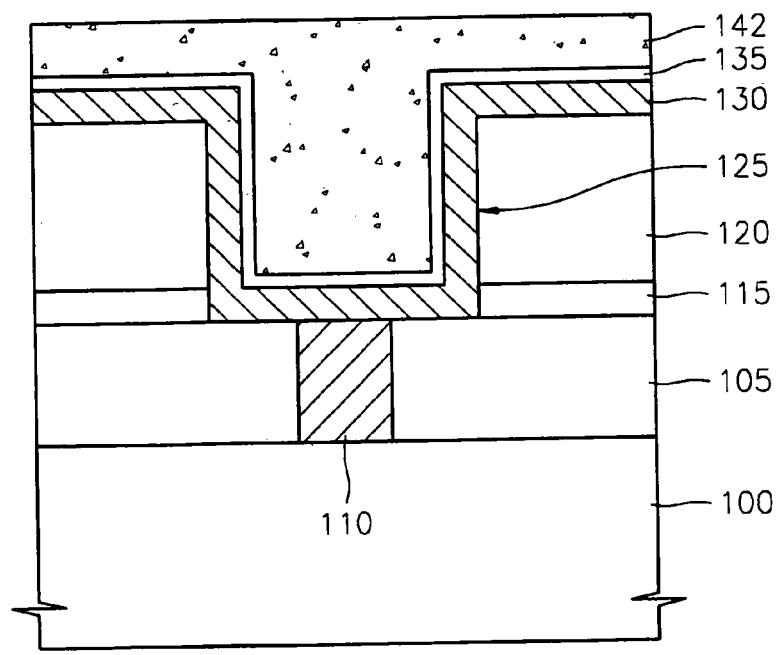
FIGS. 9A through 9C are cross-sectional views illustrating methods of manufacturing the capacitor of FIG. 8 according to further embodiments of the present invention.
Figure 9B:
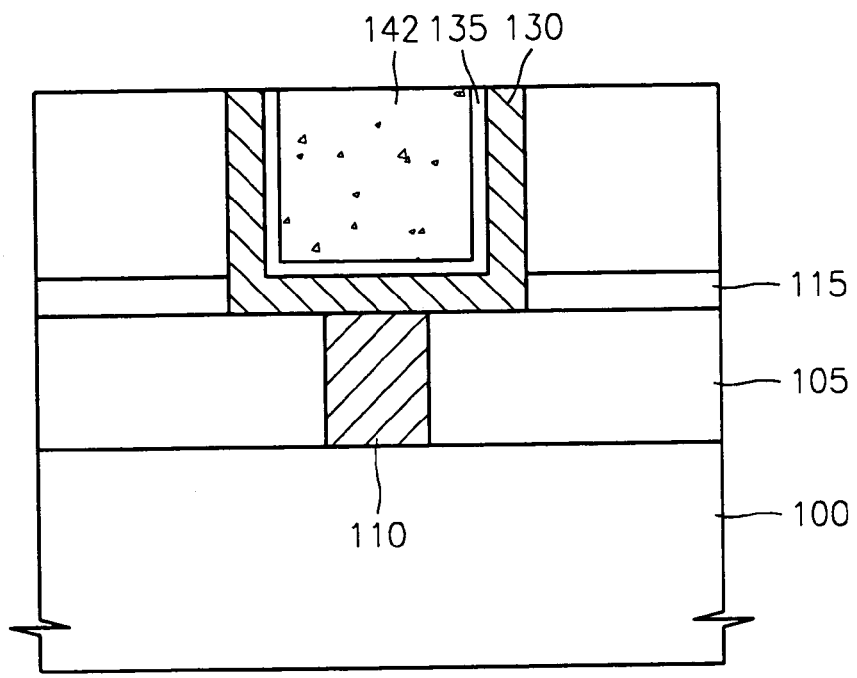
Figure 9C:
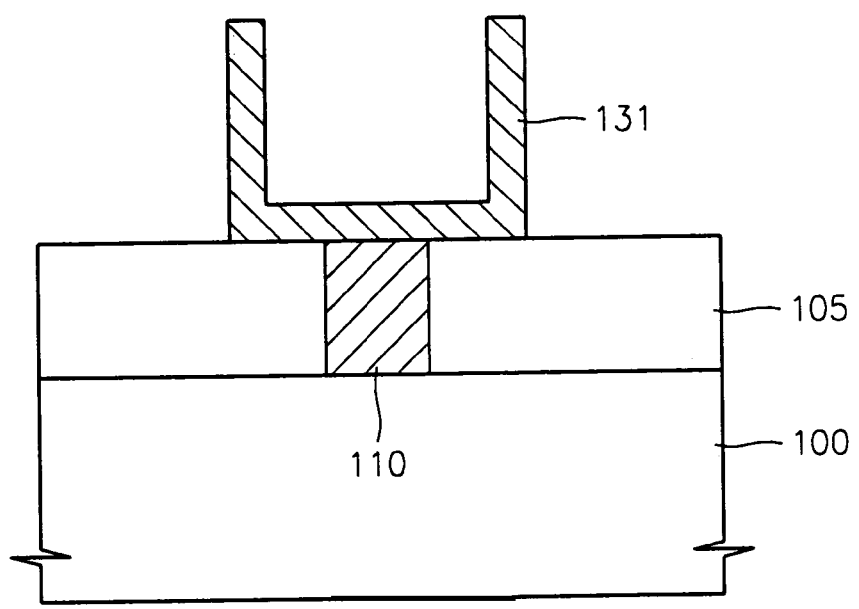

FIGS. 9A through 9C are cross-sectional views illustrating methods of manufacturing the capacitor of FIG. 8. In FIGS. 9A–9C, the same reference numerals as FIGS. 3 and 4A–4C are used to denote corresponding elements and a description thereof will not be repeated-here. Also, as formation of an ILD 105 through formation of an oxygen barrier layer 135 as shown in FIG. 4A may be the same as described previously, only subsequent processes will be further described.

Referring now to the embodiments illustrated in FIG. 9A, a buried layer 142 is formed on the oxygen barrier layer 135 to fill the lower electrode region 125. As described previously, the oxygen barrier layer 135 may be formed of a material having a better oxidative characteristic than a TiN plug 110, such as one or more of Ti, Ti-rich TiN, Al, W, and/or TaN. As used herein, a Ti-rich layer has a higher concentration of Ti than the corresponding TIN plug 110. The buried layer 142 may be formed of a material that is easily removed by etch chemicals, for example, a material having the same etch rate as that of a material for the mold oxide layer 120.

As shown in FIG. 9B, the buried layer 142, the oxygen barrier layer 135 and the Ru layer 130 may be planarized using CMP or an etchback process until the surface of the mold oxide layer 120 is exposed. Thereafter, the resultant structure of the integrated circuit (semiconductor) substrate 100 may be thermally treated in an inert gas atmosphere, for example, in a $N_2$ atmosphere, which may reduce or prevent transformation of the Ru layer 130. As a result, oxygen atoms contained in the Ru layer 130 can diffuse to the outside. However, as the oxygen barrier layer 135, which has a better oxidative characteristic than the TiN plug 110, is formed on the Ru layer 130, most of oxygen atoms contained in the Ru layer 130 may be absorbed at the oxygen barrier layer 135. Thus, diffusion of oxygen into the TiN plug 110 may be reduced or prevented, thereby protecting the TiN plug 110 from oxidation. As shown in FIG. 9C, the resultant structure may be dipped in etch chemicals for removing the silicon oxide layer to remove the mold oxide layer 120 and the buried layer 142 having little selectivity with respect to the mold oxide layer 120. Then, the oxygen barrier layer 135 remaining on the Ru layer 130 may be removed to form a cylindrical lower electrode 131. In addition, a capacitor dielectric layer may be formed on the cylindrical lower electrode and an upper electrode may be formed on the capacitor dielectric layer.

In the embodiments of FIGS. 8 and 9A–9C, the oxygen barrier layer 135 and the buried layer 142 are formed on the Ru layer 130. Also, oxygen contained in the Ru layer 130 may be exhausted at the oxygen barrier layer 135 while an electrode is thermally treated, and then the oxygen barrier layer 135 and the buried layer 142 may be removed to form the cylindrical electrode.

As described above for some embodiments of the present invention, a lower electrode may comprise a noble metal layer having a cavity, a buried layer filling the cavity and/or an oxygen barrier layer interposed between the noble metal and the buried layer. The buried layer may be formed of a material capable of absorbing additional oxygen and which is not significantly removed by etch chemicals used to remove oxide, whereas the oxygen barrier layer may be formed of a material having a better oxidative characteristic than a metal plug contacting the lower electrode.

Thus, in such embodiments, during a subsequent thermal treatment, most of oxygen atoms remaining in the noble metal layer and the dielectric layer may be absorbed on the oxygen barrier layer, which has a better oxidative characteristic than the metal plug. Oxygen atoms may also be absorbed into the buried layer. Therefore, diffusion of oxygen toward the plug may be reduced or prevented, which may protect the plug from oxidation. As a result, contact resistance between the plug and the lower electrode may be reduced so that electrical characteristics of a capacitor can be improved.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

What is claimed is:

1. A capacitor comprising:
   an integrated circuit substrate;
   an interlayer dielectric disposed on the integrated circuit substrate and including a metal plug therein;
   a lower electrode disposed on the interlayer dielectric and contacting the metal plug, the lower electrode including a cavity therein and a buried layer in the cavity, the buried layer being capable of absorbing additional oxygen ($O_2$);
   an oxygen barrier layer interposed between the lower electrode and the buried layer;
   a dielectric layer disposed on the lower electrode; and
   an upper electrode disposed on the dielectric layer.

2. The capacitor of claim 1 wherein the lower electrode comprises a noble metal layer.

3. The capacitor of claim 2 wherein the buried layer fills in the cavity and lacks $O_2$.

4. The capacitor of claim 2 wherein the metal plug comprises titanium nitride (TiN).

5. The capacitor of claim 2 wherein the noble metal layer comprises ruthenium (Ru), platinum (Pt), iridium (Ir), osmium (Os), palladium (Pd), tungsten (W) and/or cobalt (Co).

6. The capacitor of claim 2 wherein the buried layer comprises tantalum oxide (TaO), titanium dioxide ($TiO_2$), silicon nitride (SiN) and/or silicon (Si).

7. The capacitor of claim 2 wherein the oxygen barrier layer comprises a material having an oxidative characteristic greater than the oxidative characteristic of the metal plug.

8. The capacitor of claim 2 wherein the oxygen barrier layer comprises titanium (Ti), titanium rich titanium nitride (Ti-rich TiN), aluminum (Al), tungsten (W) and/or tantalum nitride (TaN).

9. The capacitor of claim 2 wherein the buried layer comprises a material that is etch resistant to etch chemicals used to etch silicon oxide.

10. A capacitor comprising:
    an integrated circuit substrate;
    an interlayer dielectric disposed on the integrated circuit substrate and including a metal plug therein;
    a lower electrode disposed on the interlayer dielectric and contacting the metal plug, the lower electrode including a noble metal layer having a cavity therein, a buried layer filled in the cavity and an oxygen barrier layer interposed between the noble metal layer and the buried layer;
    a dielectric layer disposed on the lower electrode; and
    an upper electrode disposed on the dielectric layer;
    wherein the buried layer is a material layer which lacks $O_2$ and which is capable of absorbing additional $O_2$; and
    wherein the oxygen barrier layer is a material layer having a better oxidative characteristic than the oxidative characteristic of the metal plug.

* * * * *